United States Patent
Boudou et al.

(10) Patent No.: US 11,761,820 B2
(45) Date of Patent: *Sep. 19, 2023

(54) INFRARED IMAGE SENSOR

(71) Applicant: LYNRED, Palaiseau (FR)

(72) Inventors: Nicolas Boudou, Grenoble (FR); Alexia Gorecki, Grenoble (FR)

(73) Assignee: LYNRED, Palaiseau (FR)

( * ) Notice: Subject to any disclaimer, the term of this patent is extended or adjusted under 35 U.S.C. 154(b) by 3 days.

This patent is subject to a terminal disclaimer.

(21) Appl. No.: 17/325,827

(22) Filed: May 20, 2021

(65) Prior Publication Data
US 2021/0270676 A1     Sep. 2, 2021

Related U.S. Application Data

(63) Continuation of application No. 16/466,773, filed as application No. PCT/FR2017/053403 on Dec. 5, 2017, now Pat. No. 11,060,919.

(30) Foreign Application Priority Data

Dec. 7, 2016 (FR) .................. 16/62079

(51) Int. Cl.
*H04N 5/33* (2023.01)
*G01J 5/02* (2022.01)
(Continued)

(52) U.S. Cl.
CPC .......... *G01J 5/0225* (2013.01); *G01J 5/0803* (2013.01); *G01J 5/0808* (2022.01); *G01J 5/20* (2013.01);
(Continued)

(58) Field of Classification Search
CPC ...... G01J 5/20; G01J 5/02; G01J 5/024; G01J 1/02; G01J 1/0204; G01J 1/04;
(Continued)

(56) References Cited

U.S. PATENT DOCUMENTS 5,868,496 A    2/1999  Spitzberg
6,292,685 B1   9/2001  Pompei
(Continued)

FOREIGN PATENT DOCUMENTS

EP    2602598 A1   6/2013
EP    3153831 A1   4/2017
(Continued)

OTHER PUBLICATIONS

Authorized Officer: Kostrzewa, Marek, International Search Report issued in counterpart PCT application No. PCT/FR2017/053403, dated Feb. 20, 2018, 3 pp.
(Continued)

*Primary Examiner* — Masum Billah
(74) *Attorney, Agent, or Firm* — KAPLAN BREYER SCHWARZ, LLP

(57) ABSTRACT

An image sensor includes on a support a plurality of first pixels and a plurality of second pixels intended to detect an infrared radiation emitted by an element of a scene. Each of the pixels includes a bolometric membrane suspended above a reflector covering the support, wherein the reflector of each of the first pixels is covered with a first dielectric layer, and the reflector of each of the second pixels is covered with a second dielectric layer differing from the first dielectric layer by its optical properties.

15 Claims, 5 Drawing Sheets

(51) Int. Cl.
  *H01L 27/146* (2006.01)
  *G01J 5/0803* (2022.01)
  *G01J 5/20* (2006.01)
  *G01J 5/0808* (2022.01)

(52) U.S. Cl.
  CPC .. *H01L 27/14621* (2013.01); *H01L 27/14629* (2013.01); *H01L 27/14649* (2013.01); *H04N 5/33* (2013.01); *G01J 2005/202* (2013.01); *G01J 2005/204* (2013.01)

(58) Field of Classification Search
  CPC ...... G01J 1/0411; G01J 1/0429; G01J 1/0488; G01J 5/0862; G01J 4/04; G01J 5/0215
  USPC .......................................................... 348/164
  See application file for complete search history.

(56) References Cited

U.S. PATENT DOCUMENTS

| | | | |
|---|---|---|---|
| 8,674,308 | B2 | 3/2014 | Singer |
| 8,834,019 | B2 | 9/2014 | Fraden |
| 9,733,404 | B2 | 8/2017 | Talvitie et al. |
| 11,015,978 | B2 | 5/2021 | Boudou et al. |
| 11,060,919 | B2 | 7/2021 | Boudou et al. |
| 2003/0062164 | A1 | 4/2003 | Wellington et al. |
| 2004/0183020 | A1 | 9/2004 | Del Grande |
| 2008/0095212 | A1 | 4/2008 | Jonnalagadda et al. |
| 2010/0213374 | A1 | 8/2010 | Meinel et al. |
| 2010/0292952 | A1 | 11/2010 | Pomper et al. |
| 2011/0228811 | A1 | 9/2011 | Fraden |
| 2012/0249799 | A1 | 10/2012 | Shibata |
| 2013/0146773 | A1 | 6/2013 | Ouvrier-Buffet et al. |
| 2013/0153769 | A1 | 6/2013 | Singer |
| 2014/0054462 | A1 | 2/2014 | Samarao et al. |
| 2014/0097343 | A1 | 4/2014 | Gidon et al. |
| 2015/0226612 | A1 | 8/2015 | Palanchoke et al. |
| 2016/0169738 | A1 | 6/2016 | Van Der Wiel |
| 2016/0178443 | A1 | 6/2016 | Emadi et al. |
| 2017/0102323 | A1* | 4/2017 | Boutami ............ G01N 21/3504 |
| 2017/0307445 | A1 | 10/2017 | Yildizyan et al. |
| 2019/0154511 | A1 | 5/2019 | Van et al. |

FOREIGN PATENT DOCUMENTS

| | | | |
|---|---|---|---|
| JP | 11-326039 A | | 11/1999 |
| JP | 11326039 A | * | 11/1999 |

OTHER PUBLICATIONS

Authorized Officer: Kostrzewa, Marek, International Search Report issued in related PCT application No. PCT/FR2017/053402, dated Feb. 27, 2018, 3 pp.

English Translation of the Written Opinion of the International Searching Authority issued in PCT application No. PCT/FR2017/053402, dated Feb. 27, 2018, 8 pp.

English Translation of the Written Opinion of the International Searching Authority issued in PCT application No. PCT/FR2017/053403, dated Feb. 20, 2018, 9 pp.

Search Report issued in French patent application No. 16/62079, dated Sep. 29, 2017, 2 pp.

Office Action issued in counterpart Chinese patent application No. 201780076168.2, dated Jul. 17, 2020, 6 pp.

Non-Final Rejection dated Aug. 20, 2020 for U.S. Appl. No. 16/466,723.

Non-Final Rejection dated Jun. 12, 2020 for U.S. Appl. No. 16/466,773.

Notice of Allowance and Fees Due (PTOL-85) dated Apr. 19, 2021 for U.S. Appl. No. 16/466,773.

Notice of Allowance and Fees Due (PTOL-85) dated Apr. 29, 2021 for U.S. Appl. No. 16/466,723.

Notice of Allowance and Fees Due (PTOL-85) dated Jan. 12, 2021 for U.S. Appl. No. 16/466,723.

Notice of Allowance and Fees Due (PTOL-85) dated Mar. 12, 2021 for U.S. Appl. No. 16/466,773.

Wikipedia, Infrarouge (Infrared) Definition, 7 pp., Sep. 25, 2017.

* cited by examiner

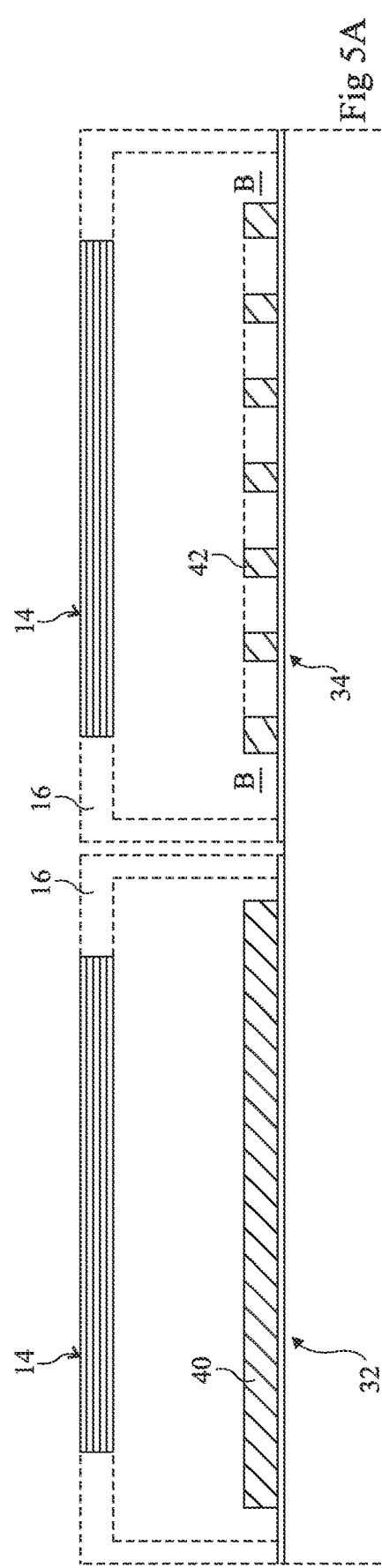
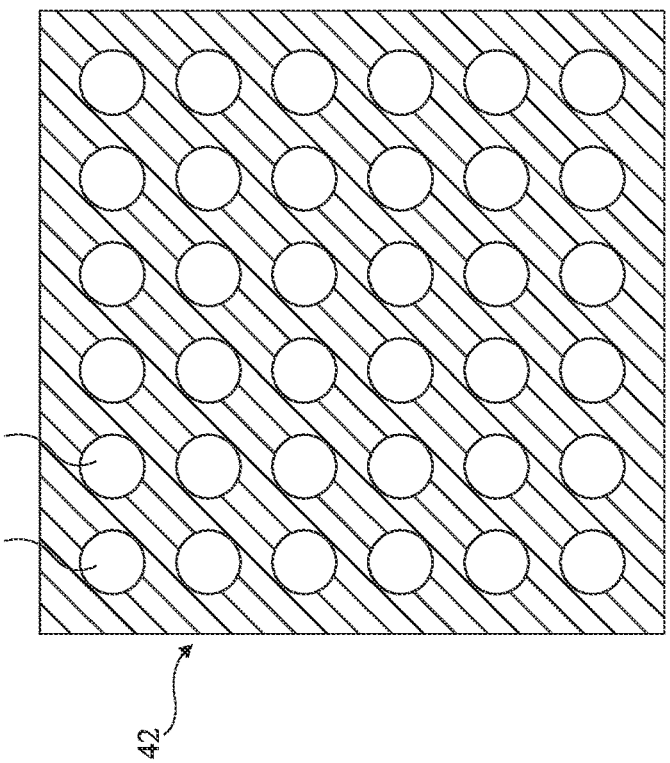

INFRARED IMAGE SENSOR

The present patent application is a continuation of U.S. patent application Ser. No. 16/466,773, which is a 371 of international application PCT/FR2017/053403, which claims the priority benefit of French patent application FR16/62079, the entire disclosures of which are incorporated herein by reference.

BACKGROUND

The present disclosure concerns the field of infrared imaging, and more particularly an infrared image sensor.

DISCUSSION OF THE RELATED ART

An infrared imaging device, such as an infrared camera in the general case, is used to form images in relation with an infrared flux originating from an observed scene, that is, with the temperatures of the elements of the scene. For thermographic applications, an estimate of these temperatures is to be provided. The camera particularly comprises an adapted focusing optical system and an infrared image sensor placed at the focus of the optical system.

FIG. 1A shows such an infrared image sensor 1. Sensor 1 comprises an assembly of pixels 3 arranged in an array and capable of operating at room temperature. Pixel array 3 is coupled to a readout integrated circuit 5 (ROIC), provided to generate electronic signals S in relation with the radiation flux reaching each pixel. The device comprises a processing unit 7 (P) capable of processing signals S and of deducing therefrom estimates of the temperatures T of the elements of the scene. Processing unit comprises calculation means and memory, and is preferably arranged in the immediate vicinity of sensor 1. This unit may also be a distant computer.

FIG. 1B is a cross-section view of an example of a pixel 3 of sensor 1 along plane B-B shown in FIG. 1A. Sensor 1 is of bolometric type, capable of operating at room temperature. Pixel 3 comprises, above a substrate 10 covered with a metal reflector 12, a planar bolometric membrane 14 suspended by arms 16. Arms 16 have a high thermal resistance, uniform for all the sensor pixels, between membrane 14 and substrate 10. The bolometric membrane comprises in the present example an absorbing metal layer 20 and a measurement layer 22. Each of layers 20 and 22 is arranged between dielectric support and separation layers 23. Measurement layer 22 is made of a material having its electric resistance varying according to temperature and provided at its ends with contacts C1 and C2. The thickness of the stack of the layers forming membrane 14 is typically in the order of 100 nm, or may be larger, for example, up to in the order of 1 µm.

Each element of the scene emits an infrared radiation according to an emission spectrum corresponding to Planck's law of the radiation of the black body weighted by the emissivity of the considered element. The wavelengths of the radiation received at the level of the focal plane are essentially in a range from 7 to 14 µm. In the general case, a thermal observation system is indeed designed to provide a maximum sensitivity between 7 and 14 µm and a negligible sensitivity outside of this range, which corresponds to the maximum emission range of a black body at room temperature. Such a radiation is absorbed by the membrane of a pixel opposite the scene element. To achieve this, in each pixel 3, distance D between the bolometric membrane and the reflector is substantially 2.5 µm, that is, approximately one quarter of the central wavelength of the concerned wavelength range. Due to the thermal resistance of arms 16, the absorbed radiation induces a heating of the membrane proportional to the power of the received radiation. The membrane temperature is thus a function of the temperature of the scene element. Signals S, from which the membrane temperature is determined, are generated by readout signal 5 based on a measurement of the electric resistance of layer 22 between contacts C1 and C2.

The membrane temperature depends both on the temperature of the scene element and on the emissivity of this element. To determine temperature T of the scene element, processing unit 7 should take into account emissivity E of this element. In other words, the inaccuracy on the emissivity value, which may notably vary from one element of the scene to another, for example, according to the material or the texture of the emitting surface, affects the value of the determined temperature. This results in a lack of accuracy of the temperature thus determined. Further, providing the emissivity of scene elements to the processing unit raises various practical use and implementation issues.

SUMMARY

An embodiment provides an infrared image sensor overcoming all or part of the above-described disadvantages.

Thus, an embodiment provides an infrared image sensor, comprising on a support a plurality of first pixels and a plurality of second pixels intended to detect an infrared radiation emitted by an element of a scene, each pixel comprising a bolometric membrane suspended above a reflector covering the support, the reflector of each first pixel being covered with a first dielectric layer, and the reflector of each second pixel being covered with a second dielectric layer differing from the first dielectric layer by its optical properties.

According to an embodiment, the optical property difference results from at least one characteristic from the following list: the first and second dielectric layers have different thicknesses; the first and second dielectric layers are made of materials having different refraction indexes; the first layer has a regular pattern and the second layer is continuous; and the first and second layers have different regular patterns in the first layer and in the second layer.

According to an embodiment, the regular pattern of the first layer extends across the entire thickness of the first layer.

According to an embodiment, the sensor comprises an array of pairs of pixels of one of the first pixels and of one of the second pixels.

According to an embodiment, the bolometric membranes of all of said pixels are structurally identical and the reflectors of all of said pixels are structurally identical.

According to an embodiment, the first and second pixels are arranged in a checkerboard layout.

According to an embodiment, the sensor is intended to detect radiations having wavelengths smaller than 25 µm.

According to an embodiment, the sensor is intended to detect radiations having wavelengths within a wavelength range, the distance in each pixel between the membrane and said dielectric layer being equal to one quarter of a wavelength located in a central portion of said range.

According to an embodiment, said range extends between 7 and 14 µm and said distance is in the range from 2 to 3 µm.

According to an embodiment, for the first dielectric layer, the product of the thickness by the refraction index is equal to one quarter of a first wavelength and, for the second dielectric layer, the product of the thickness by the refraction index is equal to one quarter of a second wavelength, the first and second wavelengths being located in said range and being different from each other.

According to an embodiment, the first and second dielectric layers are made of an identical material and have a same thickness, the distance separating the bolometric membrane from the dielectric layer being identical in the first and second pixels.

According to an embodiment, each first dielectric layer has a regular pattern formed of elements having, in directions parallel to the plane of the layer, dimensions smaller than one third of the smallest wavelength of said range.

According to an embodiment, the first and second dielectric layers are made of amorphous silicon.

According to an embodiment, the sensor comprises a circuit for reading out first values representative of the temperatures of the bolometric membranes of first and second neighboring pixels.

According to an embodiment, the sensor comprises a processing unit capable of determining the temperature or the emissivity of the scene element based on the first values.

According to an embodiment, the processing unit is capable of implementing the steps of: a) defining an initial pair of estimated temperature and emissivity values; b) calculating second values representative of the temperatures that the bolometric membranes of said neighboring pixels would have according to a theoretical model if the temperature and the emissivity of the scene element were the estimated temperature and emissivity values; c) calculating the differences between the first values and the corresponding second values; d) generating new estimated temperature and emissivity values based on said differences; and e) repeating steps b), c), and d) based on the new estimated values to decrease said differences.

According to an embodiment, the sensor further comprises a plurality of third pixels intended to detect an infrared radiation emitted by the outer scene, each third pixel comprising a bolometric membrane suspended above a reflector covering the support, where the reflector is not covered with a dielectric layer.

Another embodiment provides a pixel comprising a bolometric membrane suspended above a reflector covering a support, the reflector being covered with a dielectric layer having a regular pattern.

Another embodiment provides a pixel array such as hereabove, said regular patterns of which are identical.

BRIEF DESCRIPTION OF THE DRAWINGS

The foregoing and other features and advantages will be discussed in detail in the following non-limiting description of specific embodiments in connection with the accompanying drawings, among which:

FIG. 5A is a simplified cross-section view of two pixels of an embodiment of an infrared image sensor; and FIG. 5B is a simplified cross-section view of a pixel of FIG. 5A.

DETAILED DESCRIPTION

Figure 1A:
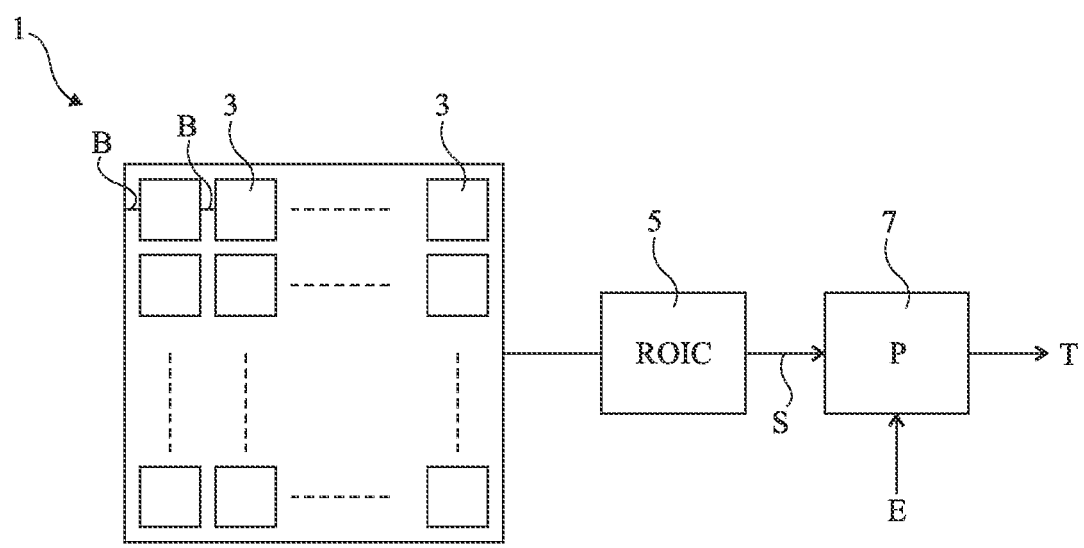
FIG. 1A schematically illustrates an infrared image sensor.

The same elements have been designated with the same reference numerals in the various drawings and, further, the various drawings are not to scale. For clarity, only those steps and elements which are useful to the understanding of the described embodiments have been shown and are detailed. In particular, membrane support arms are not shown in detail.

In the following description, when reference is made to terms qualifying a relative position, such as terms "top", "upper", "lower", etc. or to terms qualifying the orientation, such as term "lateral", reference is made to the orientation of the concerned element in the concerned drawings. The term "substantially" is used herein to designate a tolerance of plus or minus 10%, preferably plus or minus 5%, of the value in question.

In the following description, the term "refraction index" designates the real part of a refraction index having a negligible imaginary part.

Figure 2A:
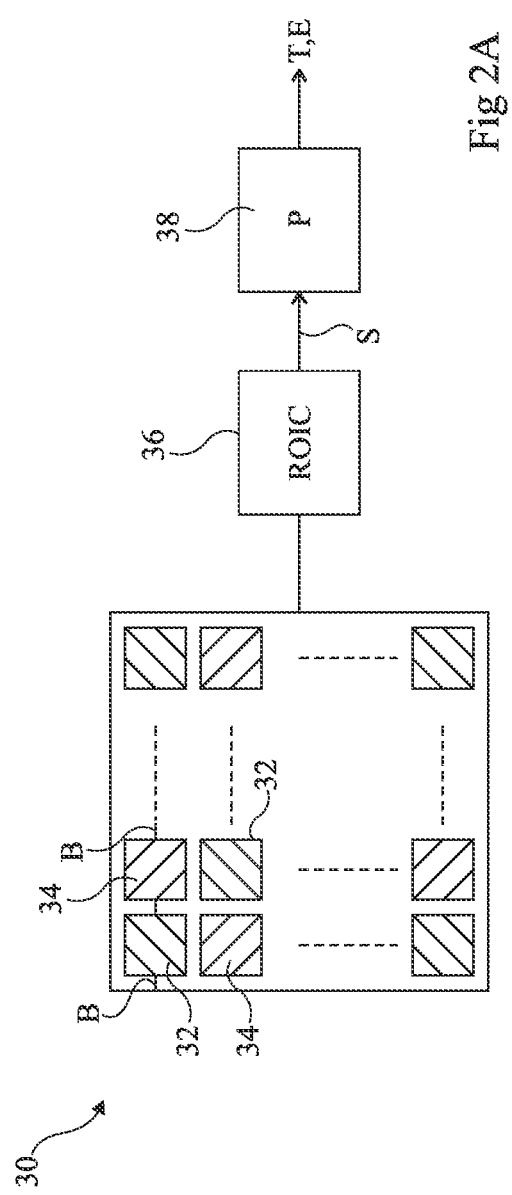
FIG. 2A schematically illustrates an embodiment of an infrared image sensor.

FIG. 2A illustrates an embodiment of an infrared image sensor 30. Sensor 30 comprises an array of pairs of pixels 32, 34, respectively of a first type and of a second type. The pixels 32 and 34 of a pair are juxtaposed, the pixels 32 and 34 of the array being for example arranged in a checkerboard layout. Sensor 30 comprises a readout circuit 36 (ROIC) coupled to pixels 32 and 34. Readout circuit 36 is provided to generate signals S representative of the temperatures of the bolometric membranes and processed by a processing unit 38 (P). Processing unit 38 is provided to determine temperatures T of elements of a scene implementing a method, an example of which will be described hereafter in relation with FIG. 4. Further, processing unit 38 may be provided to determine emissivities E of scene elements.

Figure 2B:
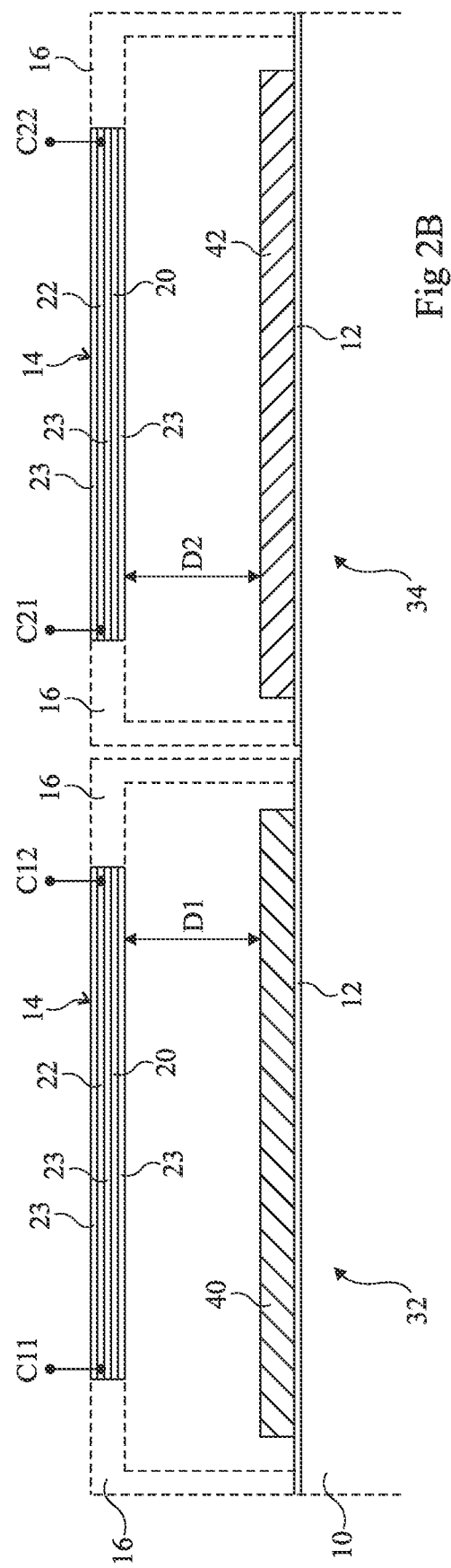
FIG. 2B is a simplified cross-section view of two pixels of FIG. 2A.

FIG. 2B is a cross-section view of neighboring pixels 32 and 34 along plane B-B of FIG. 2A.

Figure 1B:
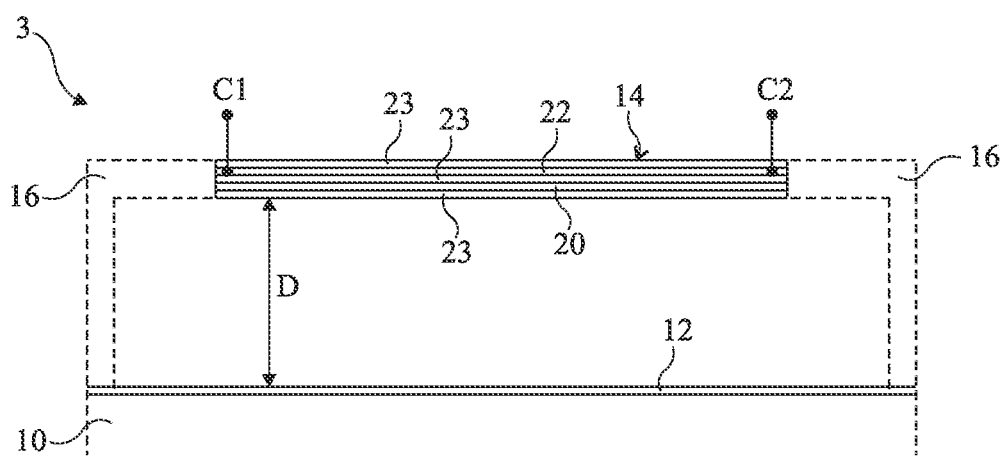
FIG. 1B is a simplified cross-section view of a pixel of the sensor of FIG. 1A.

Each of pixels 32 and 34 comprises the elements of pixel 3 of FIG. 1B. As an example, these elements are structurally identical for the two pixel types, that is, these materials are made of identical materials arranged according to identical configurations of substantially identical dimensions. Thus, each of pixels 32 and 34 comprises a bolometric membrane 14 comprising an absorption layer 20, for example, made of titanium nitride, and a measurement layer 22, for example, made of amorphous silicon, each of layers 20, 22 being arranged between dielectric layers 23, for example, made of silicon nitride or oxynitride. The measurement layer 22 of each pixel 32 is provided with contacts C11 and C12 and the measurement layer 22 of each pixel 34 is provided with contacts C21 and C22. The bolometric membrane 14 of each pixel is suspended by arms 16 above a metal reflector 12 covering a support 10, for example, a semiconductor substrate.

As an example, readout circuit 36 is formed inside and on top of substrate 10 and each pixel is coupled to readout circuit 36 by electric connections located in arms 16. As an example, the pixels are laterally repeated with a pitch in the range from 10 to 40 µm, this pitch substantially corresponding to the lateral dimensions of a pixel.

Unlike pixels 3 of FIGS. 1A and 1B, each of pixels 32 and 34 comprises a dielectric layer, respectively 40 and 42, arranged on reflector 12. Dielectric layers 40 and 42 of pixels 32 and 34 differ by their optical properties. In the illustrated example, dielectric layers 40 and 42 have same thicknesses but are made of materials having different refraction indexes. These layers may also be made of a same material and have different thicknesses. As an example, the material of layers 40 and 42 may be silicon, for example, amorphous silicon, germanium, or may contain both silicon and germanium.

Sensor 30 is for example intended to detect infrared radiations having wavelengths smaller than 25 μm, for example, smaller than 20 μm, and having frequencies greater than 12 THz, for example, greater than 15 THz.

As an example, sensor 30 is intended to detect infrared radiations located in a range which extends from 7 to 14 μm. In each of pixels 32 and 34, the distance, respectively D1 and D2, separating the lower surface of bolometric membrane 14 from the upper surface of the dielectric layer is equal to one quarter of a wavelength located in a central portion of this range, corresponding, for the range which extends from 7 to 14 μm, to distances D1 and D2 for example in the range from 2 to 3 μm. Distances D1 and D2 may thus be different and each between 2 and 3 μm. As an example, distances D1 and D2 are substantially equal, for example, are 2.5 μm, that is, then identical to the distance D separating, in pixel 3 of FIG. 1B, the bolometric membrane from the reflector.

The presence of different dielectric layers 40, 42 in pixels 32 and 34 provides the pixels with different absorption properties.

Figure 3:
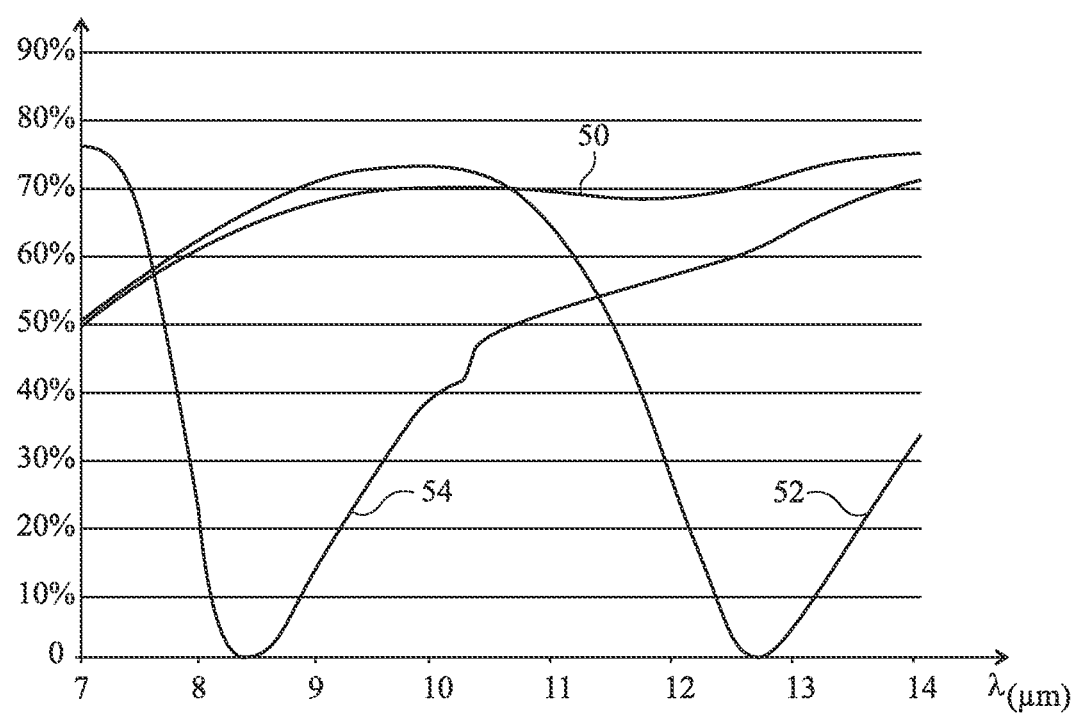
FIG. 3 shows curves of infrared radiation absorption for various types of pixels, according to the wavelength of the radiation.

FIG. 3 shows an example of spectrums of infrared radiation absorption by membrane 14 of a pixel 3 of FIG. 1B and by membranes 14 of pixels 32 and 34 of FIG. 2B according to the wavelength λ of the radiation. Curves 50, 52, and 54 respectively correspond to pixels 3, 32, and 34 and have been obtained by digital simulation.

In the example of FIG. 3, the thicknesses and the refraction indexes of dielectric layers 40 and 42 are selected so that destructive interferences appear at the level of membrane 14 for wavelengths respectively close to 12.5 μm (curve 52) and 8.5 μm (curve 54). Such specific interference conditions strongly decrease the absorption by the membrane for such wavelengths, the absorption being close to zero in the shown example. In this example, on the one hand, dielectric layer 40 of pixel 32 has a thickness of 1 μm and a refraction index of 3.5 close to that of amorphous silicon and, on the other hand, dielectric layer 42 of pixel 34 has a thickness of 1 μm and a refraction index of 2.15. In each pixel 32, 34, a decrease in the absorption of radiations having wavelengths close to a value equal to four times the product of the refraction index of the dielectric layer, respectively 40, 42, by the thickness of this layer, is obtained. This value is different for pixels 32 and 34 and is in the range from 7 to 14 μm. Thereby, the absorption properties of pixels 32 and 34 are different in this range. Dielectric layers 40 and 42 may thus have thicknesses in the range from 0.5 to 3 μm and refraction indexes in the range from 1.5 to 4.

When pixel 3 of FIG. 1B receives from a scene element a radiation having wavelengths in the range from 7 to 14 μm, the temperature of membrane 14 of pixel 3 results from the general radiation, due to the fact that the radiation is absorbed by more than 50% for all the concerned wavelengths. Conversely, when the radiation is received by pixels 32 and 34, the temperature of membrane 14 of pixel 32 mainly results from the portion of the radiation having wavelengths smaller than approximately 11 μm, and the temperature of membrane 14 of pixel 34 mainly results from the portion of the radiation having wavelengths greater than approximately 11 μm.

For two neighboring pixels 32 and 34 receiving an infrared radiation, readout circuit 36 determines two values V1 and V2 of signals representative of the respective temperatures of the bolometric membranes of the two pixels, by measuring the resistances of measurement layers 22 respectively between contacts C11 and C12 and between contacts C21 and C22. In the case where the received radiation originates from a same scene element, or from scene elements having indiscernible emissivities and temperatures, the two values V1 and V2 enable processing unit 38 to simultaneously determine the temperature and the emissivity of the scene element, due to the different absorption properties of pixels 32 and 34, as will be seen hereafter in the context of an example.

Accordingly, in the case, general in practice, where the emissivity value of the scene element is not accurately known, it is possible to more accurately determine the temperature of the scene element by using pixels 32 and 34 than by using pixel 3 of FIG. 1B.

Further, a sensor of the type of sensor 30 enables to determine the temperature of the scene element without previously knowing the emissivity of the scene element, which is not possible with a sensor of the type of sensor 1 of FIG. 1.

Further, the user does not need to manually provide an emissivity value to determine the temperature of a scene element. The temperature measurement is thus particularly convenient.

Further, for a scene comprising elements having different emissivities, the user of a sensor of the type in FIGS. 1B and 1A cannot in practice provide the emissivity of each scene element. The user is then led to supplying a common emissivity value which is not adapted to each scene element, which makes the determined temperatures inaccurate. On the contrary, in a sensor of the type of sensor 3, the different emissivity values are obtained for each scene element with no manual intervention of the user, and the determined temperatures are thereby particularly accurate.

Figure 4:
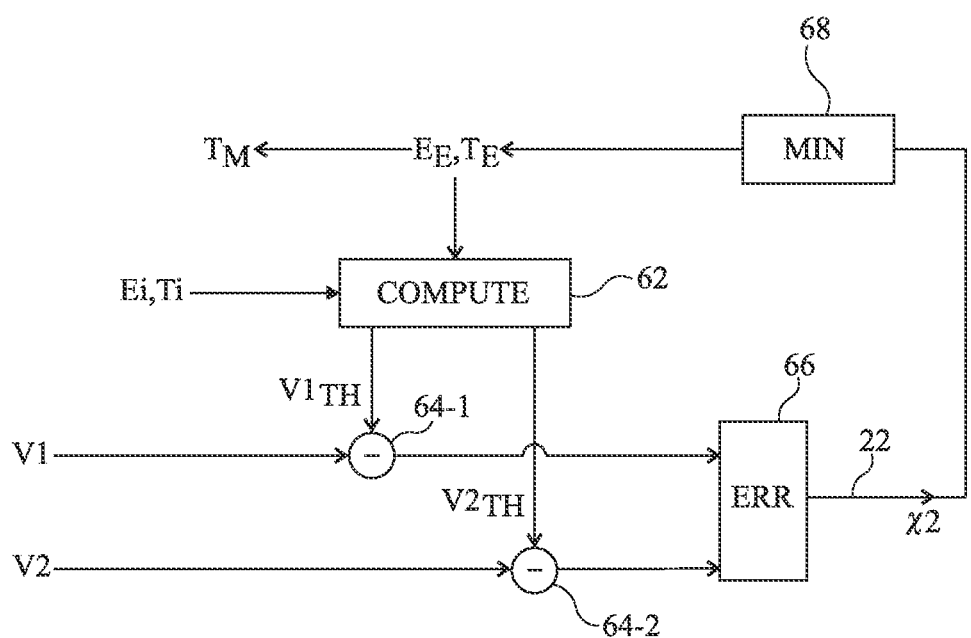
FIG. 4 illustrates a method of obtaining a temperature value.

FIG. 4 illustrates an example of a method implemented by processing unit 38 to obtain temperature $T_M$ of a scene element from two measured values V1 and V2 representative of temperature values of bolometric membranes of neighboring pixels 32 and 34.

The method comprises as an example the repeating of iterations. Each iteration takes as a starting point a pair of estimated emissivity and temperature values $E_E$ and $T_E$ and determines a new pair of estimated values which will be used as a starting point for the next iteration. At the first iteration, the estimated values $E_E$ and $T_E$ are respective initial values Ei and Ti which have been previously selected, for example, respectively, a value Ei having any emissivity between 0 and 1 and a temperature value Ti having a temperature close to the room temperature.

Each iteration comprises a modeling step 62 (COMPUTE) which determines theoretical values $V1_{TH}$ and $V2_{TH}$. Theoretical value $V1_{TH}$ corresponds to the membrane temperature value which would be obtained if the scene element was at the estimated temperature $T_E$, given the absorption properties of pixel 32 (schematized by curve 52 of FIG. 3), according to Planck's law weighted by the estimated emissivity $E_E$. It is here considered that emissivity $E_E$ is independent from the wavelength. Theoretical value $V2_{TH}$ is determined similarly, given the absorption properties of pixel 34 (schematized by curve 54 of FIG. 3). To determine theoretical values V1$_{TH}$ and V2$_{TH}$, the absorption by elements located between the scene element and the pixels, for example, the atmosphere, may further be taken into account, or transmission window may be taken into account. Such a window is currently arranged above the pixel array, or retina, to isolate the retina from the atmosphere. The transmission spectrum of such a window is known and can thus easily be taken into account to determine the theoretical values.

At steps 64_1 and 64_2, the measured values V1 and V2 are compared with theoretical values V1$_{TH}$ and V2$_{TH}$, which provides difference values V1–V1$_{TH}$ and V2–V2$_{TH}$. The difference values are used as a step 66 (ERR) to determine an error value χ2. As an example, error value χ2 is a sum of squares of the difference values, for example, a weighted sum in the form:

$$\chi 2=(1/\sigma 1^2)*(V1-V1_{TH})^2+(1/\sigma 2^2)*(V2-V2_{TH})^2,$$

σ1 and σ2 respectively representing the uncertainties of the values V1 and V2 representatives of the membrane temperatures. Each iteration then comprises a step 68 (MIN) which provides new estimated values E$_E$ and T$_E$, to decrease error value χ2, iteration after iteration. As an example, step 68 is a step of an algorithm of minimization of a value depending on two variables by successive estimations of this value based on successive estimations of the variables, such as a gradient, conjugated gradient, simplex, etc. method. The method stops when the value of χ2 is minimum. The measured value T$_M$ of the temperature of the scene element then is the value T$_E$ estimated at the last iteration. Further, the estimated value E$_E$ of the emissivity at the last iteration corresponds to a measured value E$_M$ of the emissivity of the scene element.

FIG. 5A is a cross-section view of an alternative embodiment of two neighboring pixels 32 and 34, where the dielectric layers 40 of pixels 32 and 42 of pixel 34 are made of a same material and have same thicknesses. FIG. 5B is a top cross-section view of layer 42 along plane B-B of FIG. 5A.

Layer 42 is interrupted across its entire thickness by regularly distributed openings 70. Openings 70 may have lateral dimensions smaller than the wavelengths of the received infrared radiations, for example, smaller than one third of the smallest wavelength of the wavelength range of the received radiations. As an example, the pitch of the regular array drawn by the openings is in the in order of from 1 to 3 μm. Although the shown openings have a circular shape, any other adapted shape may be used. As a variation, neighboring openings may join and layer 42 is formed of an assembly of regularly arranged separate pads. Layer 42 thus has a regular pattern of elements defined by the absence or the presence of the material of layer 42, such as openings or pads, repeated in directions parallel to the plane of the layer. Refraction index n$_{eff}$ of layer 42 may be roughly estimated by the product of the refraction index n$_s$ of the material of layer 42 by the filling rate f of layer 42. A more accurate estimate of the refraction index of layer 42 may be calculated, for example, according to the following equation described in M. E. Motamedi et al.'s article, "Antireflection surfaces in silicon using binary optics technology", published in 1992 in Applied Optics, 31(22):

$$n_{\it eff} = \left[ \frac{\left[1-f+f\times n_s^2\right] \times \left[f+(1-f)\times n_s^2\right] + n_s^2}{2\times \left[f+(1-f)\times n_s^2\right]} \right]^{1/2}$$

The refraction index of layer 42 is thus smaller than that of layer 40. Further, in the example shown in FIG. 5A, if, starting from the pattern formed by the openings in layer 42, the pattern is rotated by one quarter of a turn, the initial pattern is obtained, in other words, the pattern has a four-fold symmetry. Thereby, the refraction index of layer 42 does not depend on the polarization of the infrared radiation. As a variation, the regular pattern drawn by openings or pads may have a higher fold symmetry, for example, the six-fold symmetry of a hexagonal regular.

Specific embodiments have been described. Various variations and modifications will occur to those skilled in the art. In particular, although a specific method has been described to minimize error value χ2, any other method capable of minimizing this value may be used. As an example, after having measured values V1 and V2 representative of bolometric membrane temperature values, error value χ2 may be calculated for a set of predefined pairs of estimated temperature and emissivity values T$_E$ and E$_E$ of scene elements. The determined temperature and emissivity values correspond to the values of the predefined pair for which value χ2 is minimum. As another example, the scene element temperature corresponding to the minimum of this error value may be selected from among a set of temperature values previously determined according to a set of bolometric membrane temperature values V1, V2. The previously-determined values are then stored in processing unit 38.

Further, although, in the above-described method, a specific error value χ2 is minimized to obtain temperature value T$_M$, any error value representative of differences between, on the one hand, measured values of the membrane temperatures of two neighboring pixels and, on the other hand, corresponding theoretical values obtained by modeling, can be minimized.

Further, although, in the above-described method, a temperature value is determined in a specific manner, any other method enabling to determine the temperature of a scene element based on temperature values of two bolometric membranes of two pixels of different types opposite the scene element may be used. The absorption properties of the pixels may also be modeled by mathematical expressions enabling to explicitly express the temperature of the scene element according to those of the membranes.

Further, an example of a method enabling to obtain a temperature and emissivity value of a scene element, in the assumption where this emissivity does not depend on the wavelength, has been described hereabove. As a variation, one may, based on a previously-known temperature value of the scene element, determine two emissivity values, each corresponding to a wavelength range absorbed by one of the types of pixels 32 and 34. For this purpose, one may for example implement the above-described method, where theoretical value V1$_{TH}$ corresponds to the membrane temperature value which would be obtained if the scene element was at the previously-known temperature, given the absorption properties of pixel 32, according to Planck's law weighted by a first estimated emissivity value in the wavelength range of pixel 32, theoretical value V2$_{TH}$ being similarly determined for a second estimated emissivity value.

Although, in the above-described method example, values V1 and V2 representative of temperatures of bolometric membranes of only two neighboring pixels are used to determine the temperature of a scene element, each of values V1 and V2 may be replaced with a combination of values representative of membrane temperatures of two pixels or more of the same type opposite the same scene element.

Although, in the above-described embodiments, a readout circuit is provided to measure the temperature of bolometric membranes, the readout circuit may be provided to measure any value representative of the temperature of the bolometric membranes, for example, a resistance value.

Although, in the embodiments described herein, pixels of two different types are arranged in a checkerboard layout, the pixels may be arranged in any other way enabling each pixel of one type to be close to a pixel of another type. For example, a layout in alternated rows or columns of pixels of each type results in the same advantages. According to another specific embodiment, the pixels of a type are more numerous, that is, more densely arranged, than the pixels of another type, the proportions of the pixels being for example respectively 75% and 25%. Although the described embodiments comprise a specific bolometric membrane, any other adapted bolometric membrane may be used, for example, a bolometric membrane having a different number of dielectric layers, or a membrane where the measurement layer has been replaced with other structures of temperature measurement, for example, measurements of the deformations and/or of the stress due to thermal expansion.

Further, although the described embodiments comprise a specific type of reflector, any other reflector enabling the bolometric membrane to absorb, by more than 50% for most concerned wavelengths, the radiation emitted by scene elements, may be used.

The described specific embodiments comprise dielectric layers 42 having regular patterns and continuous dielectric layers 40, that is, in each of which the material of the layer is present above the entire bolometric membrane. Various variations are possible. It may be provided for each of dielectric layers 40 and of dielectric layers 42 to have a regular array having its elements, for example, openings or pads, laterally repeated and having lateral dimensions smaller than the wavelength of the received radiations, for example, smaller than one third of the smallest wavelength of the concerned radiation range. In the example of dielectric layers 40 and 42 made of identical materials and having identical thicknesses, the important point then is for the patterns of layers 40 and 42 to be different.

Although, in the described embodiments, only the wavelength range located between 7 and 14 μm is considered, it may be preferred to operate in another wavelength range, for example and typically by positioning this range, that is, the transmission spectrum of a filtering window, around the emission maximum according to the emission law of the black body at the average temperature of the scenes to be observed according to the specific targeted application. It will be within the abilities of those skilled in the art to accordingly adapt the transmission spectrum of each window, as well as the described pixels in terms of dimensions, in particular according to the described relations, in the space between the membrane and the reflector (distance D, thicknesses, and/or refraction indexes of the dielectric layers) to generate the selective interferences of different wavelengths inscribed in said spectrum which has thus been selected.

Further, although the described sensor embodiments are intended to detect infrared radiations located in a range which extends between 7 and 14 μm, other embodiments may be intended to detect infrared radiations located in a range which extends between 8 and 12.5 μm. For this purpose, the sensor may be arranged under a transmission window intended to limit the radiation received by the sensor to the range between 8 and 12.5 μm. The thicknesses and the refraction indexes of dielectric layers 40 and 42 are then selected so that destructive interferences appear at the level of membrane 14 for wavelengths respectively close to 8.5 μm and to 12 μm. As an example, dielectric layer 40 has a thickness substantially equal to 0.9 μm and a refraction index substantially equal to 3.5. As an example, dielectric layer 42 has a thickness substantially equal to 0.9 μm and a refraction index substantially equal to 2. The other dimensions of the device are for example identical to the corresponding dimensions in the devices of FIGS. 2A and 2B. The obtained sensor has the advantage of excluding radiations having wavelengths greater than 12.5 μm, which are absorbed by the atmosphere, and the temperature or emissivity measurement by the sensor is then independent from the quality of the atmosphere and from the distance between the sensor and the scene element. The temperature and emissivity measurement of such a sensor is then particularly accurate.

Described embodiments comprise pixels of only two different types absorbing by more than 50% the radiations located in two different ranges, the two ranges extending, in a described example, across a width of more than 3 μm. Other different embodiments, comprising more than two pixel types, are possible. As an example, each type of pixel is provided so that it absorbs by more than 50% radiations in a wavelength range different from that of the other pixel types. The extents of the wavelength ranges of the different types of pixels may be substantially identical. Such wavelength ranges may cover the extent of the wavelength range of the considered radiation. The temperature of a scene element is then determined from the more than two temperature values of bolometric membranes of the pixels of different types. This enables to more accurately determine the temperature and the emissivity of the scene element, and to more accurately determine the temperature of scene elements having an emissivity which varies according to the wavelength.

As an example, pairs of pixels 32 and 34 of the type in FIG. 2B are regularly dispersed in an assembly of pixels, or retina, comprising pixels 3 of the type in FIG. 1B. Processing unit 38 generates a first thermal image from pixels 3. Processing unit 38 superimposes to the first image a second image containing temperature and emissivity information determined from the pairs of pixels. Due to the fact that the lateral dimensions of each pixel 3 are smaller than those of a pair of pixels, the first image may have a high resolution. The obtained image contains particularly accurate temperature information and has a high resolution.

The invention claimed is:

1. An infrared image sensor comprising:
on a support a plurality of first pixels and a plurality of second pixels intended to detect an infrared radiation emitted by an element of a scene, each pixel comprising a bolometric membrane suspended above a reflector covering the support, the reflector of each first pixel being covered with a first dielectric layer arranged thereon, and the reflector of each second pixel being covered with a second dielectric layer arranged thereon, the second dielectric layer differing from the first dielectric layer by its optical properties, wherein the optical property difference results from:
the first layer having a regular pattern and the second layer being continuous; or
the first and second layers having different regular patterns, the regular pattern of the first layer extending across the entire thickness of the first layer; and
a processing unit capable of determining the temperature or the emissivity of the element of the scene based on first values representative of the temperatures of the bolometric membranes of first and second neighboring pixels wherein the processing unit is configured to implement the steps of:
a) defining an initial pair of estimated temperature and emissivity values;
b) calculating second values representative of the temperatures that the bolometric membranes of said neighboring pixels would have according to a theoretical model if the temperature and the emissivity of the scene element were the estimated temperature and emissivity values;
c) calculating the differences between the first values and the second corresponding values;
d) generating new estimated temperature and emissivity values based on said differences; and
e) repeating steps b), c), and d) based on the new estimated values to decrease said differences.

2. The sensor of claim 1, wherein the optical property difference results from: the first and second dielectric layers having different thicknesses; and/or the first and second dielectric layers being made of materials having different refraction indexes.

3. The sensor of claim 1, intended to detect radiations having their wavelengths within a wavelength range, wherein the regular pattern of the first layer is formed of elements having, in directions parallel to the plane of the layer, dimensions smaller than one third of the smallest wavelength of said range.

4. The sensor of claim 1, further comprising an array of pairs of pixels of one of the first pixels and of one of the second pixels.

5. The sensor of claim 1, wherein the bolometric membranes of all of said pixels are structurally identical and the reflectors of all of said pixels are structurally identical.

6. The sensor of claim 1, wherein the first and second pixels are arranged in a checkerboard layout.

7. The sensor of claim 1, wherein the sensor detects radiations having wavelengths smaller than 25 µm.

8. The sensor of claim 1, wherein the sensor detects radiations having wavelengths within a wavelength range, the distance in each pixel between the membrane and said dielectric layer being equal to one quarter of a wavelength located in a central portion of said range.

9. The sensor of claim 8, wherein said range extends between 7 and 14 µm and said distance is in the range from 2 to 3 µm.

10. The sensor of claim 8, wherein, for the first dielectric layer, the product of the thickness by the refraction index is equal to one quarter of a first wavelength and, for the second dielectric layer, the product of the thickness by the refraction index is equal to one quarter of a second wavelength, the first and second wavelengths being within said range and being different from each other.

11. The sensor of claim 8, wherein the first and second dielectric layers are made of an identical material and have a same thickness, the distance separating the bolometric membrane from the dielectric layer being identical in the first and second pixels.

12. The sensor of claim 1, wherein the first and second dielectric layers are made of amorphous silicon.

13. The sensor of claim 1, further comprising a circuit for reading out the first values representative of the temperatures of the bolometric membranes of first and second neighboring pixels.

14. The sensor of claim 1, further comprising a plurality of third pixels intended to detect an infrared radiation emitted by the outer scene, each third pixel comprising a bolometric membrane suspended above a reflector covering the support, where the reflector is not covered with a dielectric layer.

15. An infrared image sensor comprising:
on a support a plurality of first pixels and a plurality of second pixels intended to detect an infrared radiation emitted by an element of a scene, each pixel comprising a bolometric membrane suspended above a reflector covering the support, the reflector of each first pixel being covered with a first dielectric layer, and the reflector of each second pixel being covered with a second dielectric layer differing from the first dielectric layer by its optical properties, wherein and the optical property difference results from the fact that the first and second dielectric layers are made of materials having different refraction indexes; and
a processing unit capable of determining the temperature or the emissivity of the element of the scene based on first values representative of the temperatures of the bolometric membranes of first and second neighboring pixels;

wherein the processing unit is configured to implement the steps of:
a) defining an initial pair of estimated temperature and emissivity values;
b) calculating second values representative of the temperatures that the bolometric membranes of said neighboring pixels would have according to a theoretical model if the temperature and the emissivity of the scene element were the estimated temperature and emissivity values;
c) calculating the differences between the first values and the second corresponding values;
d) generating new estimated temperature and emissivity values based on said differences; and
e) repeating steps b), c), and d) based on the new estimated values to decrease said differences.

* * * * *